United States Patent [19]

Chauvel et al.

[11] Patent Number: 4,811,344

[45] Date of Patent: Mar. 7, 1989

[54] DEVICE FOR THE TESTING AND CHECKING OF THE OPERATION OF BLOCKS WITHIN AN INTEGRATED CIRCUIT

[75] Inventors: Gerard Chauvel; Jean Ciroux, both of Antibes, France

[73] Assignee: Texas Instruments Incorporated, Dallas, Tex.

[21] Appl. No.: 21,112

[22] Filed: Mar. 3, 1987

[30] Foreign Application Priority Data

Mar. 4, 1986 [FR] France .................. 86 02985

[51] Int. Cl.⁴ .......................................... G01R 31/28
[52] U.S. Cl. ............................................... 371/15
[58] Field of Search ....................... 371/15, 16, 20; 364/200, 900

[56] References Cited

U.S. PATENT DOCUMENTS 4,317,199  2/1982  Winslow ........................ 371/16
4,611,281  9/1986  Suko et al. .................... 364/200
4,620,303  10/1986  Tschoepe ....................... 371/16

Primary Examiner—Charles E. Aktinson
Attorney, Agent, or Firm—Gary C. Honeycutt; Melvin Sharp; N. Rhys Merrett

[57] ABSTRACT

Device for the testing and checking of the operation of blocks within an integrated circuit, characterized in that it is formed from a set of shift registers and logic circuits associated with each block of the circuit to be tested, the set of registers including at least one test register (35), one status register (36) and one mask register (37), the status register (36) being connected to the outputs (ST0 to ST15) of the block to be tested while the test and mask registers (35,37) and the logic circuits (38,39) are connected to a central processing unit (1) of the integrated circuit of which the blocks form part, the central processing unit (1) being also connected to the said blocks (7,10) by a common interrupt line (ΣINT).

5 Claims, 5 Drawing Sheets

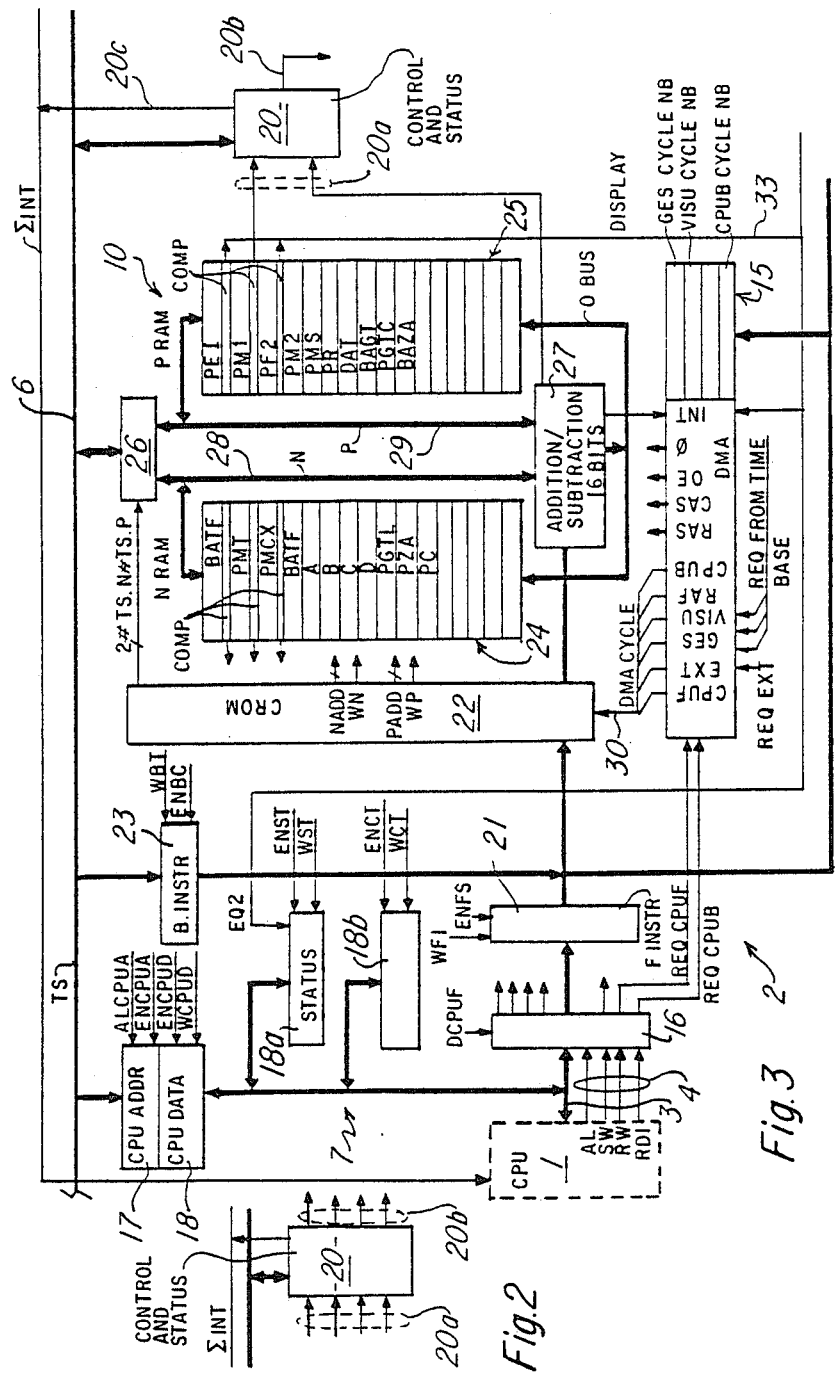

DEVICE FOR THE TESTING AND CHECKING OF THE OPERATION OF BLOCKS WITHIN AN INTEGRATED CIRCUIT

The present invention relates to devices for testing the operation of circuits and refers more particularly to a device for the testng and checking of the operation of blocks within an integrated circuit.

Within a printed circuit architecture organized in blocks, each of the sections of the circuit concerned has its own test and status signals.

These test and status signals are numerous when the function of the blocks becomes complex, particularly if the addition of signals enabling the testing of the circuit to be speeded up is desired.

It is then no longer possible to transmit all these signals independently to a central processing unit without having a multitude of interconnections between blocks.

The invention therefore aims at creating a device which enables the testing and checking of the operation of blocks within an integrated circuit without it being necessary to modify the internal structure of the integrated circuit of which the blocks to be tested form part.

Its subject is therefore a device for the testing and checking of the operation of blocks within an integrated circuit, characterized in that it is formed from a set of shift registers and logic circuits associated with each block of the circuit to be tested, the said set of registers including at least one test register, one status register and one mask register, the status register being connected to the outputs of the block to be tested while the test and mask registers and the logic circuits are connected to a central processing unit of the integrated circuit of which the blocks form part, the central processing unit being also connected to the said blocks by a common interrupt line.

The invention will be better understood with the help of the following description, given solely by way of example and with reference to the appended drawings in which:

FIG. 2 is a simplified diagram of a testing and checking device intended to be associated with a block of the circuit in FIG. 1;

FIG. 3 is a block diagram of an integrated circuit having two blocks and with which is associated a testing and checking device according to the invention;

Figure 1:
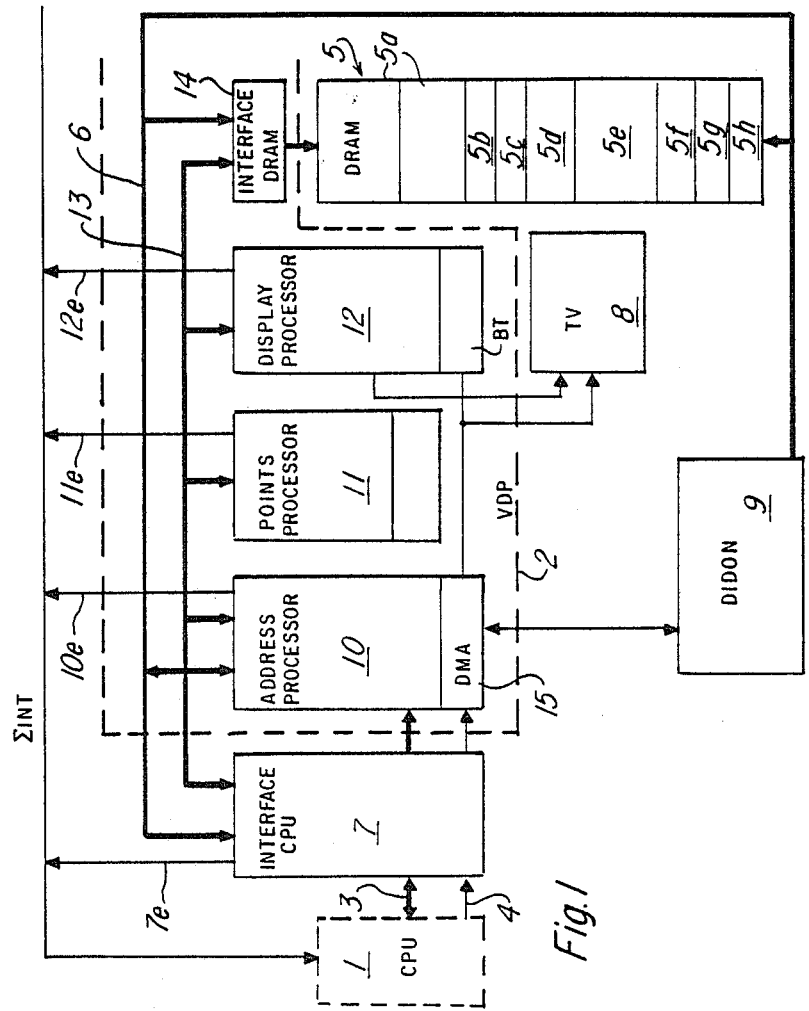
FIG. 1 is a block diagram of an integrated circuit formed from several blocks to which the testing and checking device according to the invention is applicable.

The integrated circuit shown in FIG. 1 is a system for the display of data on a video screen of the type described in French Pat. No. 84 10 377 registered on 29 June 1984 in the name of the Applicant Company.

This system includes the following units:

a central processing unit 1 hereafter called CPU which is intended to manage all the operations of the system using a program which is contained in its own memory;

a video display processor 2 called hereafter VDP communicating with the CPU 1 by a bus 3 and a control line 4, the flow of information on the bus being provided by time multiplexing for addresses and data according to the process which is described in particular in patent application Ser. No. 83 03 142, registered on the 25 of Feb. 1983 in the name of Applicant Company;

a dynamic general memory 5 called DRAM which can communicate with the other units of the system by means of a time-sharing bus 6, this bus being connected in particular to the CPU 1 via an interface 7;

a display unit 8 which can be a standard television set or an equally standard monitor, this unit being intended for the display of visual information produced in the system;

an external unit or Dido 9 by means of which the system according to the invention can communicate with an external information source which can for example be a teletext transmitter connected to the system for example through a broadcast television channel or through a telephone line or in another way.

The video display processor includes an address processor 10, a points processor 11 intended to operate the processing of points of "pixels" of the screen of the unit 8 and a display processor 12, these units all communicating with each other by means of a time-shared bus 6 and a bus 13 on which only data can flow.

The buses 6 and 13 are connected to the DRAM memory 5 by means of an interface 14 enabling the data and addresses for the DRAM 5 to be multiplexed.

There is also provided a control device 15 for dynamic memory access to the DRAM memory 5, a time-base circuit BT associated with the display processor and communicating i particular with the circuit DMA 15, the television monitor 8 and the display processor itself.

The circuit in FIG. 1 has a structure organized in blocks in such a way that each of the main sections of the system, namely:

the CPU interface 7
the address processor 10
the points processor 11
the display processor 12 has its own test and status signals.

Testing causes an operating situation and status gives a result.

According to the invention, each of the previously mentioned blocks 7, 10, 11 and 12 includes an interrupt output 7e, 10e, 11e, 12e, connected to a common line $\Sigma INT$ itself connected on the one hand to the central processing unit CPU 1 and on the other hand to the testing and checking device associated with each of the previously mentioned units as shown in FIG. 2.

This device is formed by a set 20 of registers and logic circuits which will be described in more detail in the following text with reference to FIG. 4.

The programming of the content of the registers of the set 20 is provided by the central processing unit 1 by means of the time-sharing bus 6 to which it is connected.

The set 20 includes status inputs 20a from the block 5 with which it is associated and test outputs 20b.

Finally the set includes an interrupt output 20c connected to the line ΣINT which is common to all the blocks whose operation is required to be tested.

The ΣINT line is used by the CPU 1 for the transmission of supplementing signals useful to the application considered or even for checking the development of an internal signal of a circuit during the progression of a test on that circuit.

The use of a testing device of the type shown in FIG. 2 enables:

a reduction in the number of interconnections between blocks;

access by one or more pins of the circuit to internal signals of a block, the choice of a signal being made by programming the content of one of the registers of the testing device;

a reduction in the testing time of a circuit;

the programming of a signal useful to an application, which enables a reduction in the number of components external to the circuit.

By way of example, we shall now examine, with reference to FIG. 3, the inclusion of the device according to the invention in the address processor bock 10 of the circuit in FIG. 1.

The same system can of course be used for the other blocks of the circuit with different status and test signals.

Each block operates independently from the others. Only the line ΣINT can be common to all the blocks.

FIG. 3 is a partial detailed diagram of the circuit in FIG. 1. It includes the interface 7 associated with the CPU 1 and the address processor 10 also connected to the CPU 1.

A single test and status device associated with the address processor 10 is shown.

It is connected by its status inputs 20a to the outputs of a stack of registers 25 and to an arithmetic and logic unit ALU 27 which are part of the address processor 10.

It is also connected to the time-sharing bus 6 and to the common line ΣINT connected to the central processing unit CPU 1.

The line ΣINT is also connected to a set 18a, 18b, of registers of the interface 7.

The rest of the circuit in FIG. 3 is described in French patent application Ser. No. 84 10 377.

The description of this circuit will however be continued in order to give a better understanding of the invention which is applied to it.

The interface 7 is intended to connect the CPU 1 to the VDP 2 for indirect access or to the DRAM 5 for direct access. Consequently it is capable of interpreting each address field.

The interface includes a decoder 16 connected to the bus 3, including sixteen outputs among which there are four outputs, i.e. those corresponding to the two least significant bits of the 16-bit address field, are used for the validation of four particular registers of the interface, namely;

an address transfer register 17 validated by the signal ENCPUA;

a data transfer register 18 validated by the signal ENCPUD;

a status register (STATUS) 18a validated by the signal ENST;

a test register 18b validated by the signal ENCT.

These four registers are controlled in writing or in reading by the signal R/W (in writing R/W=0) which is applied to their corresponding control inputs.

Consequently, in the case of direct access to the CPU 1, the decoder 16 generates the address transfer signals ALCPU and ENCPUA. In writing, (R/W=0) the consecutive data field is transferred in its turn into the register 18 while in reading (R/W=1) the content of this register is transferred at the end of the cycle on the bus 3 so that the CPU 1 can access the corresponding datum read in the DRAM 5. The decoder 16 also includes an output REQCPUF which enables the requesting in the DMA 15 of an access cycle to the DRAM 5.

This output is therefore connected to the circuit DMA15 so that this circuit can allocate a memory cycle (RAS and CAS signals) to the CPU 1. The cycle then allows the transfer via the bus 6 between the CPU 1 and the DRAM 5.

When the address field has a value between two chosen limits, this field is interpreted as an instruction.

These instructions can be divided into two groups respectively called "foreground instructions" (English name FOREGROUND INSTRUCTIONS) and "background instructions" (English name BACKGROUND INSTRUCTIONS). In order to facilitate the description, the abbreviation FG will be used for the first group and the abbreviation BG will be used for the second group.

Among the interpreted addresses, four addresses are intended to selectively designate the four registers 17, 18, 18a and 18b of the interface 7.

For this purpose, the last two bits of the address field can be used according to the following truth table:

| RCTL | WCTL | 00 | Register 18b |
| RST | WST | 01 | Register 18a |
| RCD | WCD | 10 | Register 18 |
| RCA | WCA | 11 | Register 17 |

(R designates a read signal and W designates a write signal).

The other instructions resulting from an interpreted address, the number of which is therefore 256−4=252, with the eight least significant bits of the address field are intended for the execution of FG cycles via an FG register 21 which is part of the interface 7 and which is connected between certain outputs of the decoder 16 and the address processor 10 and more precisely to the address inputs of a permanent CMOS memory 22 which is part of this processor.

A register 23 of the interface called the BG register is intended to be loaded with the BG instructions when it is designated by an address field whose interpretation calls one or more BG cycles. This register is designated by the three least significant bits of the address field and more precisely when these bits have the value 111.

When the BG register 23 is selected, the consecutive data field contains an instruction in sixteen bits which places the VDP in a configuration enabling the execution of a large number of memory cycles under the control of the circuit DMA 15, these cycles being processed successively unless the FG instructions interrupt the process. In this case, the DMA circuit allocates one or more FG cycles which are executed, then the BG cycles are resumed at the point at which they were interrupted, the interrupt process depending on the memory access priority being described in the previously mentioned application No. 83 03 143.

The address processor includes, in addition to the CROM memory 32, two stacks of registers 24 and 25 respectively, called NRAM and PRAM, which can be loaded and read over 16 bits through a transfer register 26 connected to the time-sharing bus 6. Each stack is connected to an arithmetic and logic unit or ALU 27, itself also directly connected to the bus 6 through the transfer register 26 and two 16-bit busses 28 and 29, N and P. The address processor is mainly used for supplying and computing all the addresses generated by the VDP in order to access the memory 5.

The memory 22, when it is addressed by part of the instruction contained either in the FG register 21, or in the BG register 23, enables the selection of a micro-instruction which is stored there in order to vali-date one or more registers of the stacks 24 and 25, an artihmetic or logical function in the ALU 27 and the transfer through register 26. The operations of the ALU 27 are controlled by five bits of the micro-instructions which can select the borrow (CI=0.1 or 2) and the addition or subtraction operation on the bus P or N 28, 29 or between these two busses.

The control memory CROM 22 also contains the signals necessary for the control of the other units of the VDP 2 in order to carry out the transfer of data and addresses between the various busses and the registers. The micro-instructions addressed in the CROM 22 are validated each time in time sharing by the circuit DMA 15 on line 30 to enable the establishment of the order of priority relating to access to the memory. In the case shown here, six priorities are thus established in the following order of enumeration:

1. CPU—FG
2. External channel (Diodo 9)
3. Display management (points processor 11)
4. Display (display processor 16)
5. Memory refresh (Memory 5)
6. CPU BG.

It therefore results from the above that the foreground cycles FG are used by the CPU 1 in order to directly access the memory or in order to access the internal registers of the VDP 2 and to do this in order to exchange with the memory only one single 16-bit word at a time.

On the other hand, a background cycle BG is executed with the lowest priority, i.e. when the VDP 2 has no other cycles to execute for the other users. The BG cycle can be triggered either by the CPU by means of an FG cycle or by the VDP 2. When it is the CPU that triggers such a cycle or group of cycles, it can, for example, be a matter of moving a group of words in the memory 5, this operation then being executed without the CPU having to intervene again after the FG cycle which has triggered them, so that it can continue to work in FG during the execution of the BG cycles, everything being managed by the DMA circuit 15 according to the established priority (in this precise case, there would be interruption and then resumption of the execution of BG cycles).

The considerable advantage of this arrangement of operations is that the various users can work and communicate at their own rate, without being interfered with by the other users, the DMA enabling the application of the appropriate priority in all cases.

The interface 14 of the DRAM 5 includes two transfer registers (31 and 32), not shown, controlled by signals provided by the micro-instructions in the CROM memory 22 and by the RAS and CAS signals coming from the DMA 15 circuit, in order to transfer the address and data fields from the bus 6 to the DRAM or vice-versa. However, data can also be directly transferred into the memory 5 from the bus 13 to addresses transferred through bus 6 and one of these registers, coming from the address processor 10.

Figure 4:
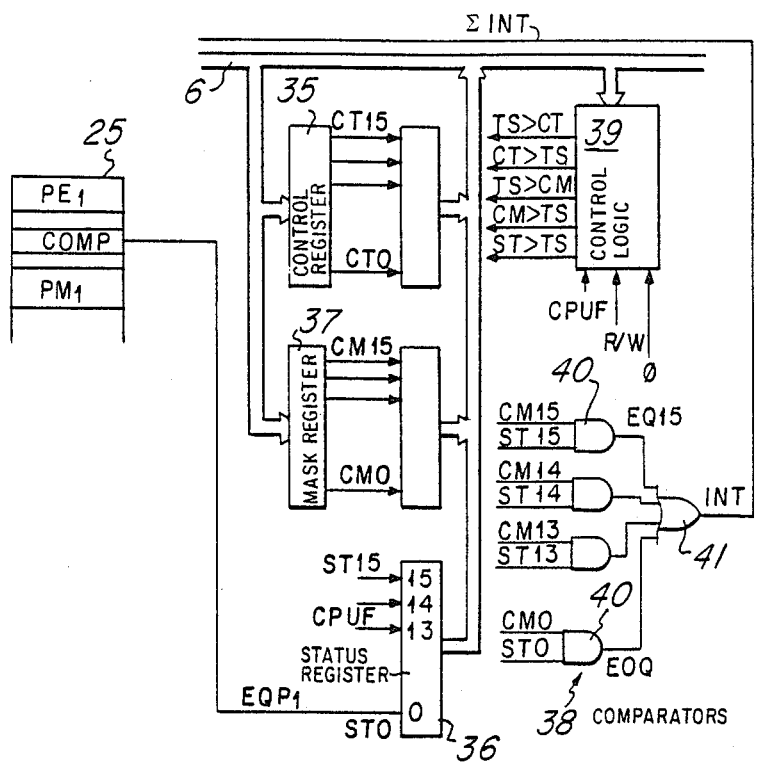
FIG. 4 is a more detailed diagram of the testing and checking device of FIG. 2.

The test device according to the invention is shown in more detail in FIG. 4.

It includes the test register 35 intended to generate signals to be sent to the internal logic of the block to be tested, a status register 36 which groups the signals reflecting the internal status of the block, a mask rester 37 which enables the selection of one or more signals that must appear on the INT line coming from the corresponding block, a comparator 38 which associates a mask bit with each status signal and which generates an INT signal when there is concordance between mask and status, and a control logic 39 which generates the transfer signals between the time-sharing bus 6 and the registers.

The loading of the test and mask registers 35 and 37 will now be described with reference to FIG. 3.

Whether it is for the testing of the interface signals of the block to be tested or for the initialization of the internal signals for an application, the test 35 and mask 37 registers must be loaded by the CPU 1 describing the application or the test.

The process of loading such registers has already been described particularly in the previously mentioned French patent application No. 84 10 377.

Figure 5:
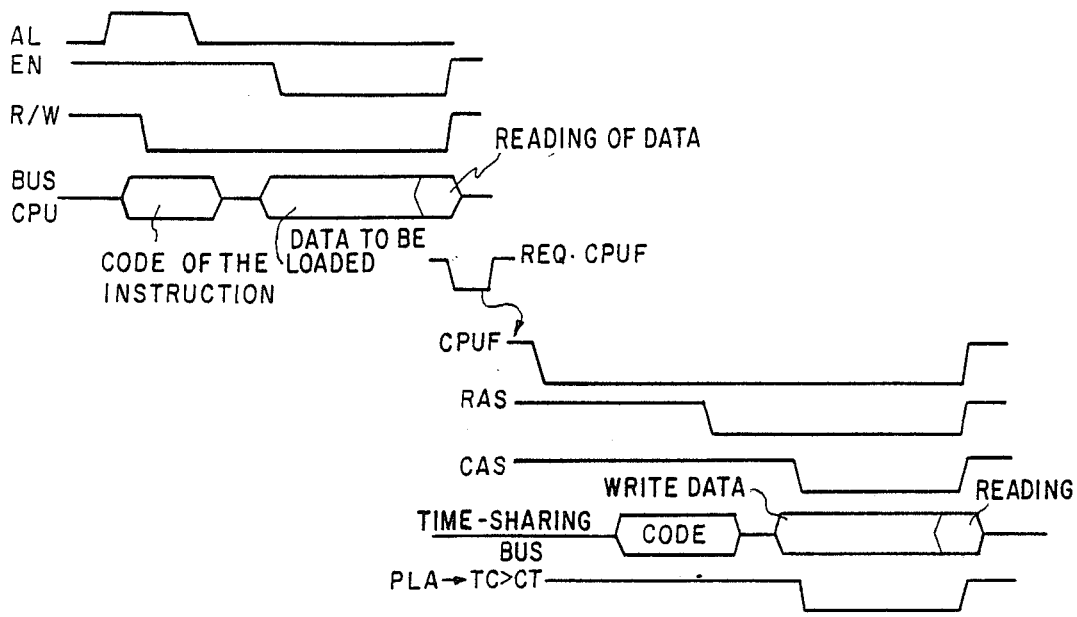
FIG. 5 is a timing diagram showing the timing of the test register loading of a testing and checking device according to the invention.

FIG. 5 shows the timing diagram of the test register loading.

The CPU 1 produces the signals AL, EN and R/W which trigger the operation.

The bus from the CPU transmits the instructions code which is interpreted by the decoder 16 of the interface 7.

This generates an access request signal Req. CPUF. The address corresponding to the instruction code is loaded into register CPU ADDR 17 and the datum, in register CPU DATA 18.

When the CPUF signal is generated by the DMA 15, the control logic 39 of the circuit in FIG. 4 interprets the instruction code and the write signal R/W=0 in order to generate the signal TS>CT which transfers the datum from the time-sharing bus 6 into the test register 35.

It should be noted that during the execution of the CPUF cycle, the multiplexed code and datum on the time-sharing bus 6 come from registers CPU ADDR 17 and CPU DATA 18 respectively which were previously loaded by the CPU cycle.

The same process takes place for the loading of the mask register 37. As the instruction code is different, it is the signal TS>CM which is generated by the control circuit 39.

In reading, by a reverse process, the content of one of the test, mask or status registers 35, 37 or 36 is transferred on the CPU bus by means of the time-sharing bus 6 and the register CPU DATA 18. The signal R/W=1 selects reading. The instruction code interpreted by the control logic 39 (FIG. 4) generates one of the signals CT>TS, CM>TS or ST>TS which transfers the content of the correspondng register into the data field of bus 6.

The generation of the INT signal is provided as follows.

Assuming that the address processor block 10 has sixteen status signals $ST_0$ to $ST_{15}$, the mask register 37 (FIG. 4) contains 16 bits $CM_0$ to $CM_{15}$.

The signals ST and CM of the same index and combined in an AND gate 40 of the comparator 38 produce signals $EQ_0$ to $EQ_{15}$ respectively. The INT signal results from a logic OR operation carried out on signals $EQ_0$ to $EQ_{15}$ by a sixteen input OR gate 41.

If all the bits $CM_0$ to $CM_{15}$ are at the zero level, the INT output is at the zero level.

If a mask bit $CM_n$ is at ONE, the shape of the corresponding signal $ST_n$ is copied on the INT output.

If several mask bits CM are at the logic ONE level, the INT output of gate 41 is a signal corresponding with the sum of all the status bits selected by the mask register 37.

The INT line of each block is connected by a hard wired OR circuit (gate 41) to the line ΣINT which, in the same way, generates a signal corresponding to the sum of all the blocks.

The signal ΣINT is used by an application as follows.

It is assumed that for an application it is necessary to have a signal of equality between an address and a pointer in order to stop a data transfer sequence between the CPU 1 and the memory associated with the circuit.

The CPU 1 must transfer data in memory 5 (FIG. 1) for example from address 1000 to address 1080, without being preocuupiep with number of access tests or with end of process address tests.

The signal ΣINT applied to an input terminal of the CPU 1 will interrupt the process.

During the initialization phase, the CPU 1 programs the content of the registers PE1, PM1, of the stack 25 (FIGS. 3 and 4), the first value being the end of run address PE1=1080 and the second value being the address of the first writing PM1=1000.

The mask resister 37 is programmed to select the signals ESP1 coming from the comparator of the contents of the registers PE1 and PM1 of the address processor 10 and CPUF from the DMA block 15. As the other mask bits are at zero all of the signals except $EQ_{13}$ and $EQ_0$ are forced to zero and have no effect on the INT signal.

During the data transfer, the CPU selects the pointer PM1 as a memory access address and on each CPUF cycle, the pointer PM1 is incremented.

From address 1000 to address 107F, the signal EQP1 is at the high level as there is no equality between PE1 and PM1.

The signal EQ0 remains at the ONE level, INT and INT (sic) remain at ONE.

The CPU continues its accesses.

Figure 6:
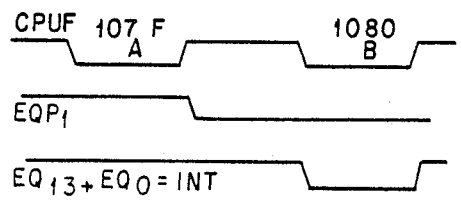
FIG. 6 is a diagram showing an example of data transfer between the central processing unit of the circuit to be tested and the said testing device.

At the end of the cycle represented in A on the graph in FIG. 6, the address computation PM1=107F+1 makes EQP1 switch to the "0" level since PE1=PM1=1080.

During cycle B, the signals CPUF and EQP1 both being at the low level, all the inputs of the OR gate 41 are at the low level and the INT signal is at the low level.

The CPU 1 receives a signal ΣINT=0 on its interrupt terminal and stops the data transfer.

The ΣINT terminal of the CPU 1 can also be used for a test.

The test 35, mask 37 and status 36 resisters can be used for testing the logic sub-assemblies of a block for the purpose of reducing the test time of the integrated circuit.

Figure 8:
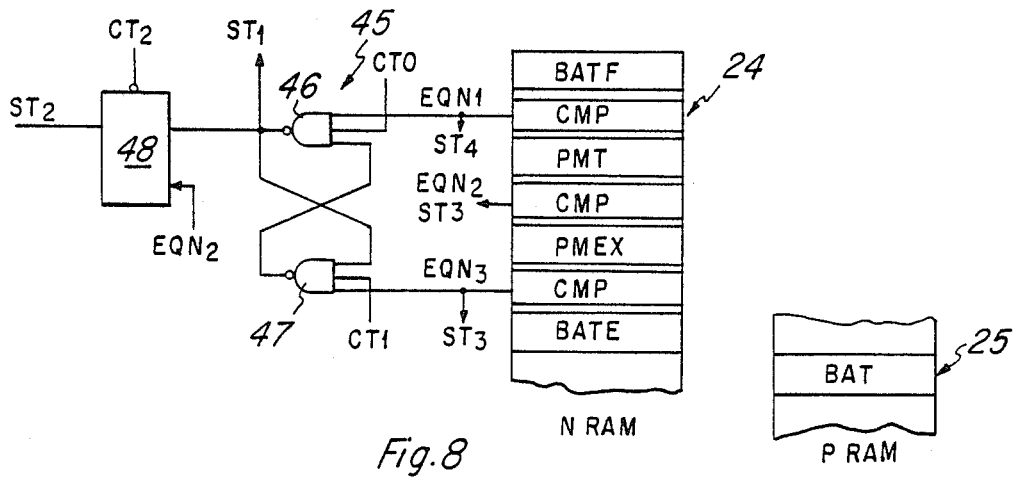
FIG. 8 is a diagram of a circuit for the checking of the operation of a logic using the device of the invention.

FIG. 8 shows an example of the means and of the process for checking the operation of a circular buffer management logic.

FIG. 8 gives a section of the stack of registers 24 of the address processor 10 to which is connected an RS flip-flop 45 formed from two three-input NAND gates 46, 47. A first input of gate 46 is connected to an output EQN1 of the stack of registers 24, a second input is connected to the output CTO of the test register 35 (FIG. 4) and a third input is connected to the output of gate 47.

A first input of gate 47 is connected to the output of gate 46 which forms a status input ST1 of the status register 36. A second input of the gate 47 is connected to output CT1 of the test register 35 and a third input is connected to output EQN3 of the stack of registers 24.

The outputs EQN1 and EQN3 of the stack are also connected to inputs ST4 and ST3 of the status register 36.

The output of the RS flip-flop 45 is connected to a flip-flop 48 whose other input is connected to EQN3 and whose two outputs deliver the signals ST2 and CT2.

Figure 7:
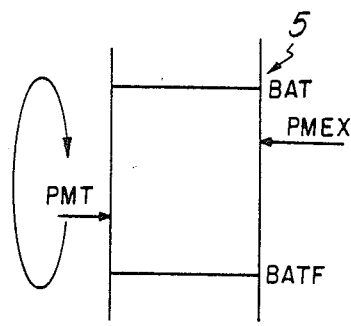
FIG. 7 is a diagram showing an example of the checking of the operation of a subassembly of a block of integrated circuit.

The circuit buffer is defined by two addresses, the start address BAT and the end address BATF of the registers stack 25. It is part of the memory 5 (FIG. 1). During use, two pointers PMT and PMEX (FIG. 7) are used to access this area.

PMEX is used for writing data in the buffer on each external channel DMA EXT cycle.

PMT is used by the CPU to read data from the buffer.

In normal use, during the initialization phase, the buffer start address BAT is transferred into the two pointers PMT and PMEX.

During each EXT cycle, the PMEX pointer is incremented until it is equal to BATE.

When PMEX=BATE (EQN3=0), PMEX is reloaded with BATE and the RS flip-flop 45 (FIG. 8) changes state ST1=0.

The recycling of the PMT pointers is identical.

EQN1=0 sets ST1=1

In normal use, the EXT channel loads data into the memory, the PMEX pointer progresses between the two buffer limits. On its side, the CPU 1 accesses data by the pointer PMT as long as there is no equality between PMT and PMEX (EQN2=0).

If there is equality, this means that PMT has reached PMEX and that the CPU must stop.

In an abnormal operation of the block, if PMEX generally progresses faster than PMT, the equality EQN2=0 reoccurs, the pointer PMEX being one cycle ahead (ST1=0).

There is an overflow of the buffer capacity which is indicated by the flip-flop 48.

The signal EQN2 loads the state of the RS flip-flop 45 into the flip-flop 48. ST2=0.

This output can be reset to "1" only by the signal CT2.

To speed up the testing of this circular buffer management system, bits CT0, CT1 and CT2 of the test register 35 are used for presetting a state of the RS flip-flop 45 and the flip-flop 48 (FIG. 8) while the signals ST1, ST2, ST3 and ST4 are selected on the ΣINT pin one by one by the corresponding mask bits.

For example, in order to test the comparators EQN1, EQN2 or EQN3, the corresponding registers are loaded with equal values by the CPU 1 or a tester which checks on pin ΣINT if the result is correct.

The operation of the RS flip-flop 45 can be checked as follows.

Different values are loaded into the pointers.

CT0 is set to "0" and CT1 to "1".

The tester checks ST1=1 on pin ΣINT validated by the mask bit CM1=1 from the mask register 37.

The other states of the management system signals can be checked by using different test signal configurations.

The above test has shown the way in which the pin ΣINT is programmed in order to generate a signal which is the combination of one or more internal signals, the signal ΣINT being used by the CPU 1 as an interrupt signal.

The same system can be used to activate internal sub-blocks for the purpose of speeding up the testing of a circuit.

Figure 9:
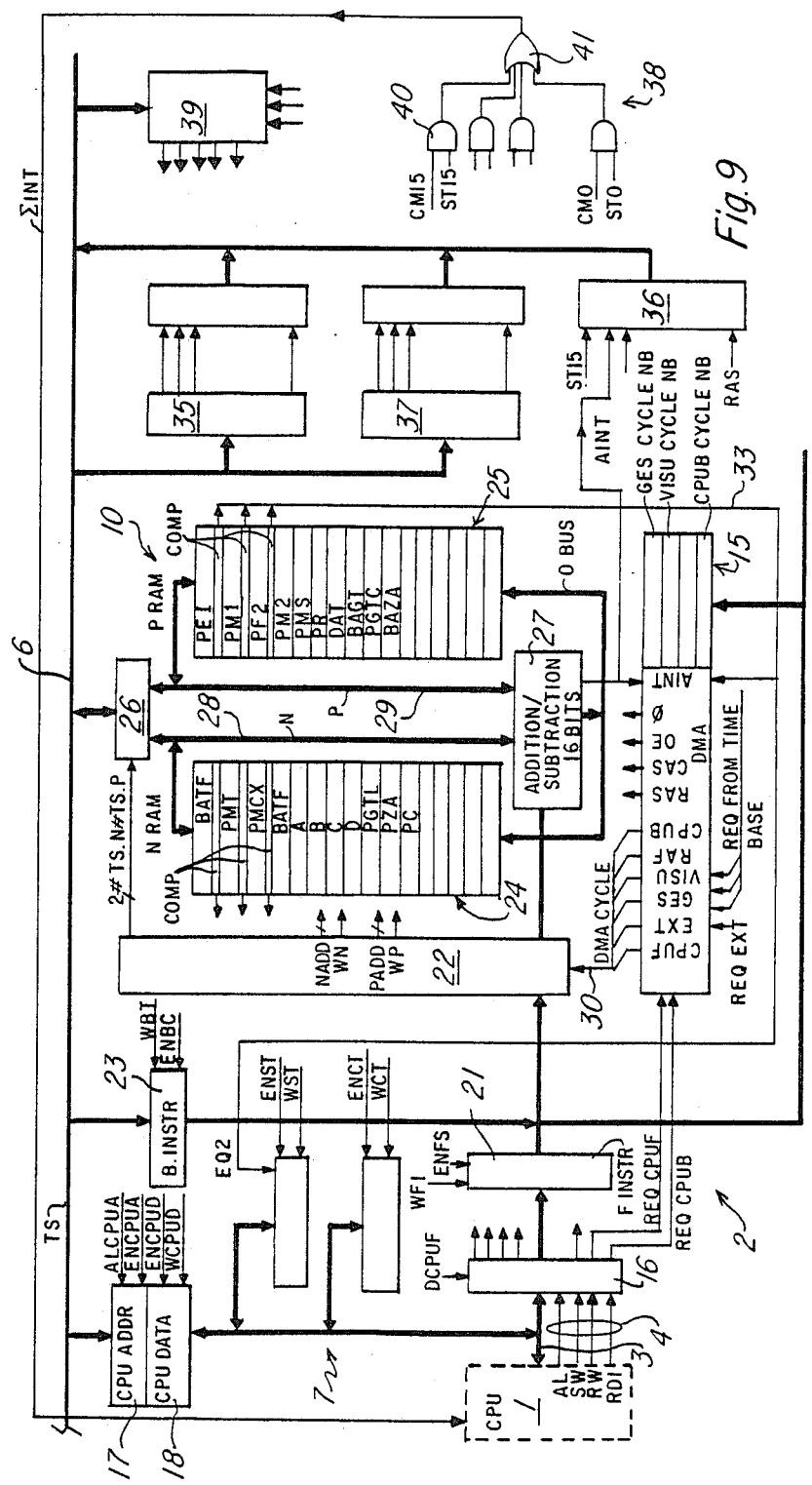
FIG. 9 is a block diagram of an integrated circuit with which is associated a testing and checking device according to the invention.

The test and status system can be used for checking, with an oscilloscope or a tester, the dynamic behaviour of an internal signal using signals available on the pins of the circuit, for example the signals RAS and CAS and the oscillator of the DMA 15 (FIG. 9), as a time reference.

For example, it is possible to check the computing time of the adder and more precisely the column address AINT borrow signal of the DMA 15.

For this purpose, the AINT terminal of the DMA 15 is connected to pin ST14 of the status register 36 of the test and status device.

The tester programs the content of the mask register 37 with CM14=1 which validates the AINT signal on the ΣINT line.

To activate AINT, the tester selects a control which increments a pointer, for example PM1 to a value A on each cycle.

The A register containing a value such that AINT changes on each CPUF cycle.

Figure 10:
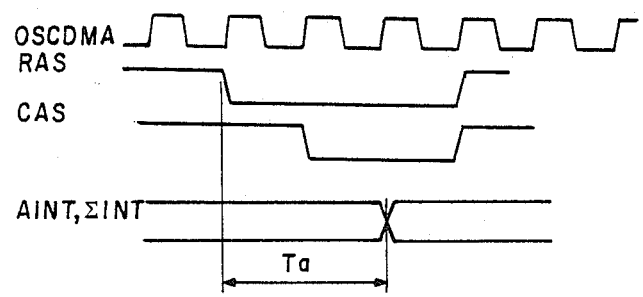
FIG. 10 is a diagram showing the shape of the signals at certain points in the circuit of FIG. 8.

The waiting time Ta can be very easily checked on the ΣINT pin by taking as a reference the oscillator of the DMA 15, RAS or CAS which are available on the pins of the circuit (FIG. 10).

The choice of critical signals connected to the status register 36 thus enables the checking of a multitude of internal signals without using a traditional process which necessitates a large number of connections on the pins of the circuit or a probe test which can be carried out only in specialized laboratories.

I claim:

1. Device for the testing and checking of the operation of blocks within an integrated circuit, comprising a set of shift registers and logic circuits associated with each block of the circuit to be tested, the said set of registers including at least one test register, one status register and one mask register, the status register being connected to the outputs of the block to be tested while the test and mask registers and the logic circuit are connected to a central processing unit of the integrated circuit of which the blocks form part, the central processing unit being also connected to the said blocks by a common interrupt line.

2. Device according to claim 1, wherein the said logic circuits include a comparator of status signals coming from the block to be tested and mask signals delivered by the mask register, the said comparator being connected by the said interrupt line to the central control logic unit.

3. Device according to claim 2, wherein said comparator is formed from as many AND gates as there are outputs of the block to be tested one input of each gate being intended to receive a status signal from the said block and another input of this gate being connected to an output of the mask register of the same position.

4. Device according to claim 1, further including means connected with at least one internal sub-block of the block to be tested, intended to activate and test the corresponding internal sub-block.

5. Device according to claim 1, further including a device for checking the electrical propagation time of a signal within a block to be tested.

* * * * *